United States Patent
Pigoso Destro et al.

(10) Patent No.: US 11,349,340 B2
(45) Date of Patent: May 31, 2022

(54) SYSTEM AND METHOD FOR OPTIMIZING THE SENSING OF ELECTROMAGNETIC WAVES

(71) Applicant: Ibbx Inovacao em Sistemas de Software e Hardware Ltda, Capivari (BR)

(72) Inventors: Luis Fernando Pigoso Destro, Mombuca (BR); William Norberto Aloise, Sao Paulo (BR); Vanderlei Goncalves, Capivari (BR)

(73) Assignee: IBBX INOVAÇÃO EM SISTEMAS DE SOFTWARE E HARDWARE LTDA

( * ) Notice: Subject to any disclaimer, the term of this patent is extended or adjusted under 35 U.S.C. 154(b) by 0 days.

(21) Appl. No.: 17/269,846

(22) PCT Filed: Feb. 18, 2020

(86) PCT No.: PCT/BR2020/050046
§ 371 (c)(1),
(2) Date: Feb. 19, 2021

(87) PCT Pub. No.: WO2020/168404
PCT Pub. Date: Aug. 27, 2020

(65) Prior Publication Data
US 2021/0257854 A1    Aug. 19, 2021

(30) Foreign Application Priority Data

Feb. 18, 2019   (BR) .......................... 1020190032839

(51) Int. Cl.
*H01F 27/42* (2006.01)
*H01F 37/00* (2006.01)
(Continued)

(52) U.S. Cl.
CPC ............ *H02J 50/001* (2020.01); *H02J 50/20* (2016.02)

(58) Field of Classification Search
CPC . H02J 5/005; H02J 7/025; H02J 17/00; H01F 38/14; B60L 11/182
(Continued)

(56) References Cited

U.S. PATENT DOCUMENTS 9,525,209 B2 *  12/2016  Tanabe ..................... H02J 7/02
9,985,442 B2 *   5/2018  Von Novak, III ...... H02J 5/005
(Continued)

OTHER PUBLICATIONS

International Search Report (with English translation) dated Jun. 15, 2020 for International Application No. PCT/BR2020/050046.
(Continued)

*Primary Examiner* — Quan Tra
*Assistant Examiner* — Anh-Quan Tra
(74) *Attorney, Agent, or Firm* — Fay Sharpe LLP

(57) ABSTRACT

This invention refers to a system comprising an oscillation capture module, an impedance matching module, a capture optimizer module and an ground, the oscillation capture module comprising means for tuning and capturing electromagnetic waves, the impedance matching module comprising at least one impedance matching circuit associated with a control module, the capture optimizer module being configured to capture a negative half-cycle of an electromagnetic wave through the ground, and the ground being arranged between the oscillation capture module and the impedance matching module.
The present invention also refers to a method for optimizing the capture of electromagnetic waves through the use of such a system.

7 Claims, 3 Drawing Sheets

Figure 1:
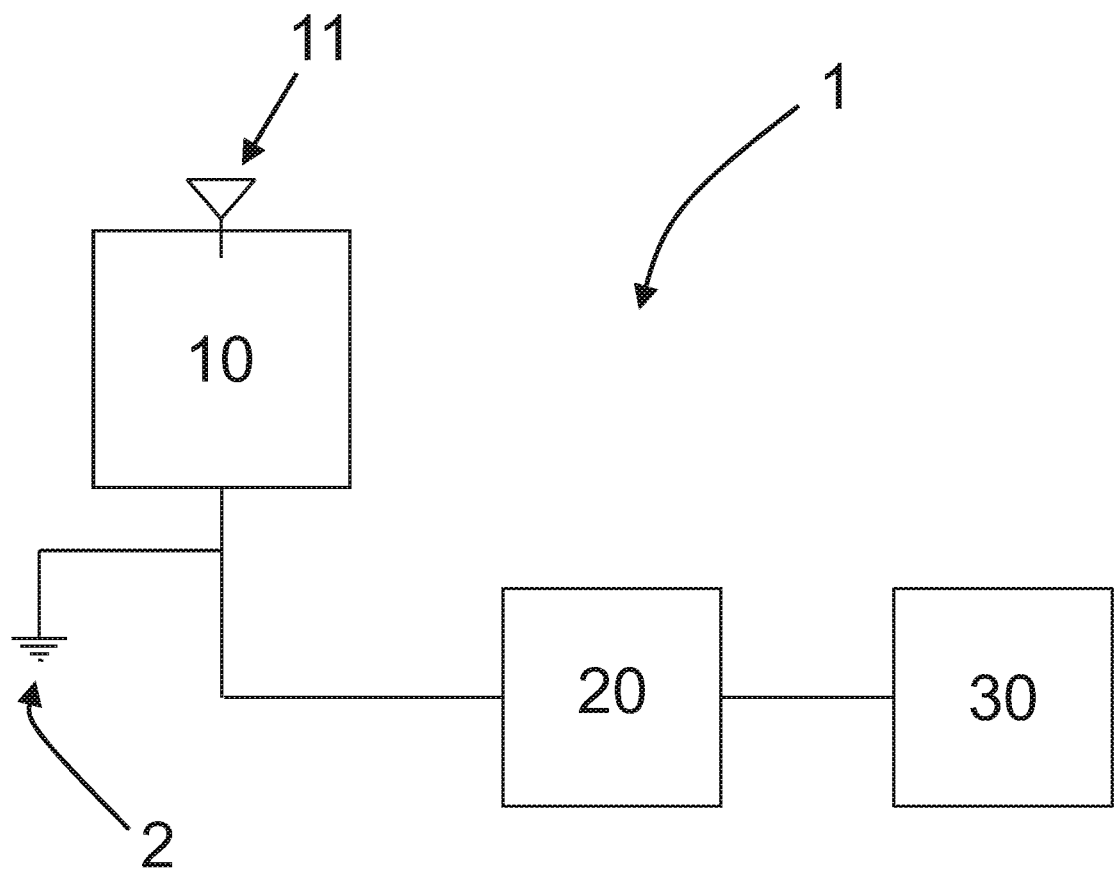

(51) Int. Cl.
    *H01F 38/00*       (2006.01)
    *H02J 50/00*       (2016.01)
    *H02J 50/20*       (2016.01)

(58) Field of Classification Search
    USPC .......................................................... 307/104
    See application file for complete search history.

(56) References Cited

U.S. PATENT DOCUMENTS

| | | |
|---|---|---|
| 10,520,997 B2 | 12/2019 | Sen et al. |
| 2008/0143192 A1 | 6/2008 | Sample et al. |
| 2010/0190435 A1* | 7/2010 | Cook ...................... H02J 50/20 |
| | | 455/41.1 |
| 2011/0127845 A1* | 6/2011 | Walley .................... H02J 50/70 |
| | | 307/104 |
| 2012/0013296 A1 | 1/2012 | Heydari et al. |
| 2013/0154560 A1* | 6/2013 | Walley .................... H02J 50/10 |
| | | 320/108 |
| 2015/0035372 A1* | 2/2015 | Aioanei ................. H02J 50/60 |
| | | 307/104 |
| 2017/0093168 A1* | 3/2017 | Von Novak, III ...... H02J 50/80 |
| 2017/0300098 A1 | 10/2017 | Sen et al. |

OTHER PUBLICATIONS

Written Opinion of the International Searching Authority dated Jun. 15, 2020 for International Application No. PCT/BR2020/050046.

\* cited by examiner

SYSTEM AND METHOD FOR OPTIMIZING THE SENSING OF ELECTROMAGNETIC WAVES

This invention refers to an optimizer system for capturing electromagnetic waves and a method for optimizing electromagnetic wave capture.

DESCRIPTION OF THE STATE OF THE ART

Systems and apparatus intended for the capture of electromagnetic waves and their conversion into useful energy are already known to the state of the art.

Usually, such systems basically comprise means for capturing the desired electromagnetic waves and means for converting said oscillation signals into usable energy. For merely exemplative purposes, a system capable of capturing and converting electromagnetic waves may comprise an antenna, responsible for capturing the various electromagnetic waves desired and a circuit responsible for converting the alternating energy of said signals into continuous energy, which can be stored or used for a desired purpose.

These circuits may comprise subsystems such as amplifier circuits, rectifier circuits and regulatory circuits, among others.

However, it is known that when an electromagnetic wave is captured, in an ideal situation where no reflections or losses occur, only half the useful energy of said electromagnetic wave can be harnessed.

This is because, during the capture and conversion/rectification of the oscillatory signal, only the positive half-cycle of the wave is used. This situation results in limitations in the yield of such systems, where only half the useful energy of the electromagnetic wave can be used, regardless of the electrical variables of the signal (frequency, amplitude, power, etc.).

Thus, a system capable of capturing electromagnetic waves and converting them, using all the available energy from the signal, is not observed in the state of the art.

Which is to say, a system capable of capturing electromagnetic waves, subsequently allowing the conversion/rectification of the energy from the signal into useful energy, using both the positive and negative half-cycles of the captured electromagnetic wave, is not observed in the state of the art.

OBJECTIVES OF THE INVENTION

A first objective of this invention is to provide an optimizer system for capturing electromagnetic waves.

A second objective of this invention is to provide a method for optimizing the capture of electromagnetic waves.

BRIEF DESCRIPTION OF THE INVENTION

The objectives of this invention are achieved by means of a system for optimizing electromagnetic wave capture, the system comprising an oscillation capture module, an impedance matching module, a capture optimizer module and a ground, the oscillation capture module comprising means for tuning and capturing electromagnetic waves, the impedance matching module comprising at least one impedance matching circuit associated with a control module, the capture optimizer module being configured to capture a negative half-cycle of an electromagnetic wave through the ground, and the ground being arranged between the oscillation capture module and the impedance matching module.

The objectives of this invention are also achieved by means of a method for optimizing electromagnetic wave capture through the use of a system for optimizing electromagnetic wave capture, the system comprising an oscillation capture module, an impedance matching module, a capture optimizer module and a ground, the oscillation capture module comprising means for tuning and capturing electromagnetic waves, the impedance matching module comprising at least one impedance matching circuit associated with a control module, the capture optimizer module being configured to capture a negative half-cycle of an electromagnetic wave through the ground, and the ground being arranged between the oscillation capture module and the impedance matching module, the method comprising the steps of capturing a positive half-cycle of the electromagnetic wave through the oscillation capture module;

capturing a negative half-cycle of an electromagnetic wave through the impedance matching module and the capture optimizer module; and transmitting the positive and negative half-cycles captured to the oscillation capture module.

SUMMARIZED DESCRIPTION OF THE DRAWINGS

Figure 2:
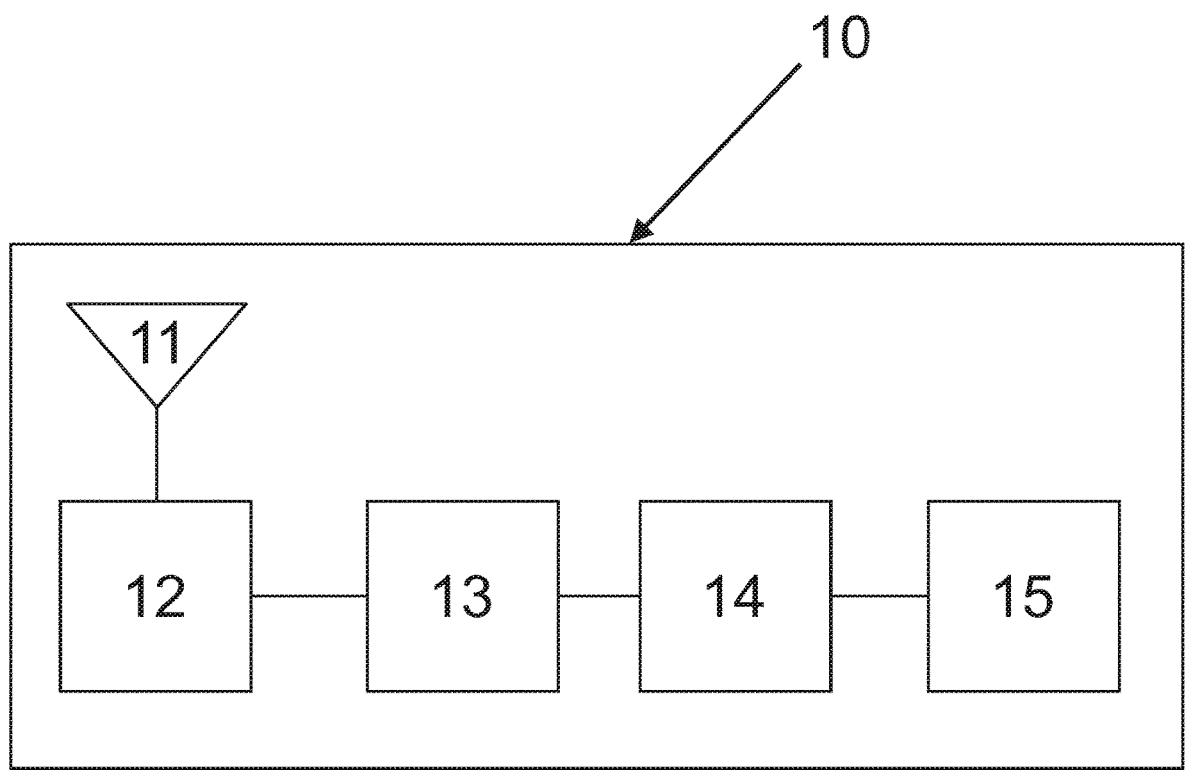

This invention will be described below in more detail based on an example of execution represented in the drawings. The figures show the following:

FIG. 1—illustrates a possible embodiment of the system for optimizing electromagnetic wave capture;

FIG. 2—illustrates a possible embodiment of the oscillation capture module.

Figure 3:
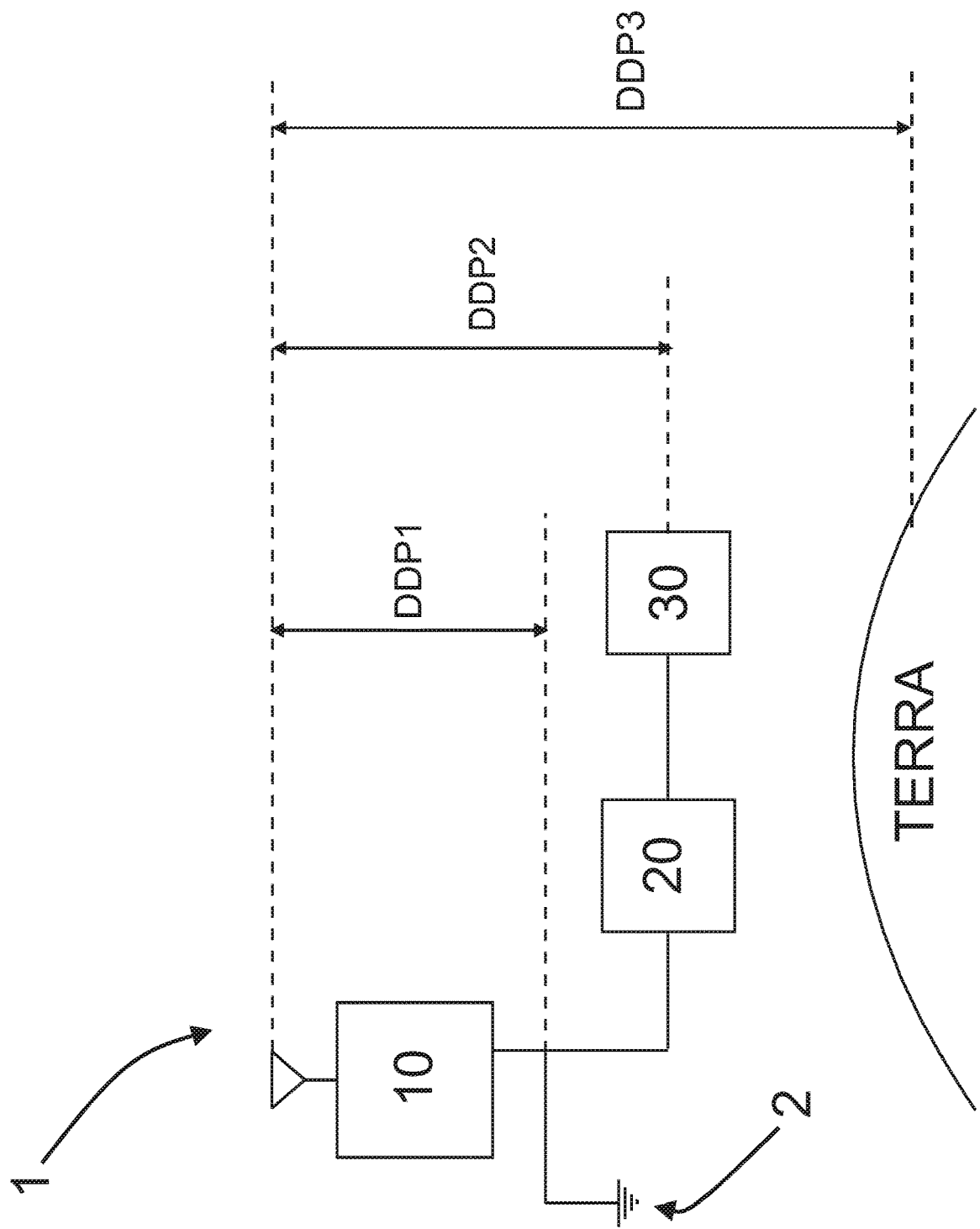

FIG. 3—illustrates the difference in potentials obtained between the systems already known to the state of the art and the system that is the object of the present invention.

DETAILED DESCRIPTION OF THE FIGURES

The present invention refers to a system 1 for optimizing electromagnetic wave capture.

More specifically, the system 1 for optimizing electromagnetic wave capture comprises an oscillation capture module 10, an impedance matching module 20, and a capture optimizer module 30, as illustrated in FIG. 1.

The oscillation capture module 10 comprises means for tuning and capturing electromagnetic waves. Such means may be any devices and/or systems known to the state of the art able to tune and capture electromagnetic signals of one or more frequencies, subsequently amplifying and rectifying them in order to convert said signals into useful energy, capable of being used in a desired or stored application.

In a preferred embodiment, the oscillation capture module 10 comprises a capture antenna 11 associated with a tuner circuit 12, an amplification block 13, an adjustment and rectification block 14, and a storage block 15. This embodiment of the oscillation capture module 10 is illustrated in FIG. 2.

When in operation, an electromagnetic signal will be tuned and captured by the capture antenna 11 and the tuner circuit 12, subsequently being amplified by the amplification block 13. Then, after being amplified, the electromagnetic signal will be rectified by the adjustment and rectification block 14 in order to be stored in the storage block 15. The electromagnetic signal, before being rectified, is an alternating signal (AC). However, in order to make it possible to store the useful energy from this signal in the storage block 15, the signal must be rectified, turning it into a continuous signal (DC). Moreover, the storage block 15 can be any power storage medium known to the state of the art.

The impedance matching module 20 comprises at least one impedance matching circuit 21 associated with a control module 22. The impedance matching circuit 21 is configured to allow the power from any electromagnetic signal captured by the system to be used to the maximum.

As is already known to the state of the art, when circuits have different input and output impedances, reflections and losses occur during the passage of the signal through these circuits. Thus, the use of so-called "impedance matching" circuits enables the "matching" of the output impedance from a first system from which the signal arises with the input impedance from another system which receives the signal.

Specifically, with reference to the present invention, the impedance matching circuit 21, present in the impedance matching module 20, allows the input impedance from the system 1 to be adjusted to the impedance from the electromagnetic signal which will be captured, thus allowing said signal to be captured with minimal possible losses/reflections.

Control module 22 is, in a preferred embodiment, a microcontroller. However, this embodiment should not be understood as a limitation of the present invention, such that any control device known to the state of the art can be used.

Moreover, in this merely preferred embodiment, the impedance matching circuit 21 comprises a set of variable capacitance diodes or a keyed capacitor bank and an induction assembly.

When the oscillatory signal enters the microcontroller, its impedance is analyzed and, for each impedance value, the microcontroller sends a signal to the variable capacitance diodes so that its capacitance is altered. Thus, the input impedance of the circuit is altered depending on each signal received, ensuring maximum power transfer in the circuit.

Alternatively, it should be noted that the components that make up the oscillation capture module 11 do not necessarily have to be fixed value components. For merely exemplative and non-limiting purposes, the electrical components that compose the impedance matching circuit 21 can be components with adjustable values such as variable capacitors, potentiometers, variable capacitance diodes, variable inductors, etc.

These variable value components can be used, especially when there is more than one frequency of the signals that are intended to be captured. In addition to this, the use of components with variable values allows for greater flexibility of design and adjustment of the system, allowing the signal that is intended to be captured to be transferred with maximum efficiency to the other modules.

The capture optimizer module 30 comprises a conductor cable assembly 31, with predetermined dimensions depending on the parameters of the electromagnetic wave it is intended to capture, such as period, amplitude, etc.

Additionally, the capture optimizer module 30 also comprises an inductor block 32. In a preferred embodiment, said inductor block 32 comprises at least one inductive system keyed by a semiconductor key.

Said inductive system keyed by semiconductor keys is configured to adjust the impedance of the reference (ground) of the system 1 by simulating a "virtual" conductor cable larger than the conductor cable 31 present in the capture optimizer module 30.

It is already known from the teachings of the state of the art that the capture of electromagnetic waves through tuner circuits results in the capture of only half the useful energy of the tuned wave.

Considering an ideal situation, where the wave is captured in its entirety, without reflections and losses, it is known that only the positive half-cycle of the electromagnetic wave is captured and converted into useful energy. This results in the use of only half the useful energy available in the electromagnetic signals present in the environment.

In this regard, the use of an impedance matching module 20 electrically associated with a capture optimizer module 30, as proposed in the present invention, allows for the capture of the negative half-cycle of the magnetic wave tuned and captured by the system 1.

As can be observed from FIGS. 1 and 3, between the oscillation capture module 10 and the impedance matching module 20 a reference point 2 of the system 1, also called a ground 2, is present. The ground 2 of the system 1 refers to a reference point of the circuit through which the voltages and currents of the system are referenced.

Thus, in a system that does not comprise the impedance matching module 20 and the capture optimizer module 30, such as the various circuits and devices already known to the state of the art, the resulting energy in the output of the oscillator capture module is proportional only to the conversion of the positive half-cycle of the captured wave and is taken in reference to the ground 2. As illustrated in FIG. 3, the difference in potential of this output signal is referenced as DDP1.

The present invention, which uses an impedance matching module 20 and a capture optimizer module 30, allows the negative half-cycle of the tuned and captured electromagnetic wave to also be converted into useful energy by the system 1.

To this end, and as mentioned earlier, the capture optimizer module 30 comprises a conductor cable 31 and an inductor block 32. The conductor cable, associated with the inductor block 32, operates analogously to a "virtual" antenna, additional to the system 1.

In this regard, the conductor cable 31 will tune and capture the negative half-cycle of the wave tuned and captured by the capture antenna 11 of the oscillation capture module 10.

In addition, the inductor block 32 operates as a resonant circuit, so as to adjust the input impedance of the module 30 in order to allow the capture of the negative half-cycle of the wave with minimal possible losses. To this end, the inductor block 32, on receiving the negative half-cycle of the electromagnetic wave, adjusts the impedance of the components that compose it, in order to simulate an "additional length" for the conductor cable 31, thus adjusting the total input impedance of the capture optimizer module 30 and allowing the negative half-cycle of the electromagnetic wave to be captured with minimal possible losses and reflections.

In this scenario, using the impedance matching module 20 and the capture optimizer module 30 both still electrically associated with the oscillation capture module 10, it is possible to completely capture the desired electromagnetic signal, which is to say, to capture both the positive half-cycle and the negative half-cycle of the electromagnetic wave.

The positive half-cycle will be captured by the oscillation capture module 10 and the negative half-cycle will be captured by the impedance matching module 20 and the capture optimizer module 30 assembly.

At this point, the ground 2 of the system 1 will be a common point for both parts of the system. Which is to say, since the impedance matching module 20 and the capture optimizer module 30 are electrically associated with the oscillation capture module 10, the various stages of amplification, adjustment and signal rectification of this module, as previously described above, will be performed in a signal comprising both the positive half-cycle of the electromagnetic wave and the negative half-cycle.

Thus, in the output of the system, the converted useful energy will have greater power, since both the positive and negative half-cycles are amplified, adjusted and rectified. As illustrated in FIG. 3, the difference in potential of this output signal, considering the use of the impedance matching module 20 and the capture optimizer module 30, is referenced as DDP2.

Moreover, FIG. 3 illustrates a difference in potential DDP3. This DDP3 refers to the difference in potential if the system had a grounding point in the soil (GROUND). This scenario illustrates an ideal situation, where the difference in potential obtained is the maximum. However, as such a scenario is not an objective of the present invention, since the present system does not necessarily need to be grounded in the soil, the difference in maximum potential obtained is DDP2.

As mentioned above, this difference in potential is obtained through the use of the impedance matching module 20 and the capture optimizer module 30, in order to enable this difference in maximum potential DDP2 to be obtained.

Thus, FIG. 3 shows, illustratively, that DDP2 is greater than DDP1, demonstrating that the use of the impedance matching module 20 and the capture optimizer module 30 results in a greater power gain compared to the systems and devices already known and used in the state of the art, which do not use the impedance matching module 20 and the capture optimizer module 30.

Having described an example of a preferred embodiment, it should be understood that the scope of the present invention covers other possible variations, being limited only by the content of the attached claims, including the possible equivalents.

The invention claimed is:

1. A system (1) for optimizing electromagnetic wave capture, the system (1) comprising:
   an oscillation capture module (10),
   an impedance matching module (20),
   a capture optimizer module (30), and
   a ground (2),
   the oscillation capture module (10) comprising means for tuning and capturing electromagnetic waves, said oscillation capture module (10) being configured to capture a positive half-cycle of an electromagnetic wave,
   the impedance matching module (20) comprising at least one impedance matching circuit (21) associated with a control module (22),
   the capture optimizer module (30) and the impedance matching module (20) being configured to capture a negative half-cycle of an electromagnetic wave through the ground, and
   the ground (2) being arranged between the oscillation capture module (10) and the impedance matching module (20),
   wherein the oscillation capture module (10) comprises a capture antenna (11), a tuner circuit (12), an amplification block (13), an adjustment and rectification block (14) and a storage block (15).

2. The system as set forth in claim 1, wherein the impedance matching circuit (21) comprises at least one set of variable capacitance diodes or a bank of keyed capacitors and an inductor assembly.

3. The system as set forth in claim 1, wherein the control module (22) is a microcontroller.

4. The system as set forth in claim 1, wherein the capture optimizer module (30) comprises a conductor cable (31) and an inductor block (32).

5. A method for optimizing electromagnetic wave capture through the use of a system (1) for optimizing electromagnetic wave capture, the system (1) comprising an oscillation capture module (10), an impedance matching module (20), a capture optimizer module (30) and a ground (2), the oscillation capture module (10) comprising means for tuning and capturing electromagnetic waves, the impedance matching module (20) comprising at least one impedance matching circuit (21) associated with a control module (22), the capture optimizer module (30) being configured to capture a negative half-cycle of an electromagnetic wave through the ground, and the ground (2) being arranged between the oscillation capture module (10) and the impedance matching module (20), wherein the oscillation capture module (10) comprises a capture antenna (11), a tuner circuit (12), an amplification block (13), an adjustment and rectification block (14) and a storage block (15), the method comprising the steps of:
   capturing a positive half-cycle of the electromagnetic wave through the oscillation capture module (10);
   capturing a negative half-cycle of an electromagnetic wave through the impedance matching module (20) and the capture optimizer module (30); and
   transmitting the positive and negative half-cycles captured to the oscillation capture module (10).

6. The method for optimizing electromagnetic wave capture as set forth in claim 5, further comprising the steps of:
   amplifying the positive and negative half-cycles;
   rectifying the positive and negative half-cycles amplified in the previous step; and
   storing the rectified energy in a storage block.

7. A system (1) for optimizing electromagnetic wave capture, the system (1) comprising:
   an oscillation capture module (10);
   an impedance matching module (20);
   a capture optimizer module (30);
   a ground (2);
   the oscillation capture module (10) comprising an electromagnetic wave tuning and capturing circuit, said oscillation capture module (10) being configured to capture a positive half-cycle of an electromagnetic wave;
   the impedance matching module (20) comprising at least one impedance matching circuit (21) associated with a control module (22);
   the capture optimizer module (30) and the impedance matching module (20) being configured to capture a negative half-cycle of an electromagnetic wave through the ground;
   the ground (2) being electrically arranged between the oscillation capture module (10) and the impedance matching module (20),
   wherein the oscillation capture module (10) comprises a capture antenna (11), a tuner circuit (12), an amplification block (13), an adjustment and rectification block (14) and a storage block (15).

* * * * *